United States Patent
Chakravarti et al.

(10) Patent No.: US 7,776,624 B2
(45) Date of Patent: Aug. 17, 2010

(54) METHOD FOR IMPROVING SEMICONDUCTOR SURFACES

(75) Inventors: Ashima B. Chakravarti, Hopewell Junction, NY (US); Judson Robert Holt, Wappingers Falls, NY (US); Jeremy John Kempisty, Poughkeepsie, NY (US); Suk Hoon Ku, Beacon, NY (US); Woo-Hyeong Lee, Poughquag, NY (US); Amlan Majumdar, White Plains, NY (US); Ryan Matthew Mitchell, Wake Forest, NC (US); Renee Tong Mo, Briarcliff Manor, NY (US); Zhibin Ren, Hopewell Junction, NY (US); Dinkar Singh, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/168,945

(22) Filed: Jul. 8, 2008

(65) Prior Publication Data

US 2010/0009524 A1 Jan. 14, 2010

(51) Int. Cl.
*H01L 21/00* (2006.01)

(52) U.S. Cl. .................. 438/4; 438/404; 438/947; 438/977; 257/E21.214; 257/E21.564

(58) Field of Classification Search .................. 438/294, 438/404, 479, 645, 697, 699, 759, 4, 295, 438/974, 977; 257/E21.09, E21.092, E21.102, 257/E21.564
See application file for complete search history.

(56) References Cited

U.S. PATENT DOCUMENTS

| | | | |
|---|---|---|---|
| 6,599,758 B2 * | 7/2003 | Kenny et al. | 438/4 |
| 6,774,040 B2 * | 8/2004 | Comita et al. | 438/689 |
| 7,338,886 B2 * | 3/2008 | Liu et al. | 438/483 |
| 2001/0046746 A1 | 11/2001 | Yokokawa et al. | |
| 2005/0164435 A1 | 7/2005 | Park et al. | |
| 2005/0272187 A1 * | 12/2005 | Murthy et al. | 438/151 |

* cited by examiner

*Primary Examiner*—Ha T. Nguyen
*Assistant Examiner*—Daniel Whalen
(74) *Attorney, Agent, or Firm*—Schmeiser, Olsen & Watts; Katherine S. Brown

(57) ABSTRACT

A semiconductor fabrication method. The method includes providing a semiconductor substrate, wherein the semiconductor substrate includes a semiconductor material. Next, a top portion of the semiconductor substrate is removed. Next, a first semiconductor layer is epitaxially grown on the semiconductor substrate, wherein a first atomic percent of a first semiconductor material in the first semiconductor layer is equal to a substrate atomic percent of the substrate semiconductor material in the semiconductor substrate.

9 Claims, 5 Drawing Sheets

METHOD FOR IMPROVING SEMICONDUCTOR SURFACES

FIELD OF THE INVENTION

The present invention relates generally to semiconductor device fabrication and more particularly to method for improving semiconductor surfaces for semiconductor structure fabrication.

BACKGROUND OF THE INVENTION

Semiconductor devices are conventionally formed on semiconductor surfaces. The more planar the semiconductor surfaces are, the higher quality the semiconductor devices have. Therefore, there is a need for a method for improving semiconductor surfaces.

SUMMARY OF THE INVENTION

The present invention provides a semiconductor fabrication method, comprising providing a semiconductor substrate, wherein the semiconductor substrate comprises a substrate semiconductor material; removing a top substrate portion of the semiconductor substrate; and after said removing is performed, epitaxially growing a first semiconductor layer on the semiconductor substrate, wherein a first atomic percent of a first semiconductor material in the first semiconductor layer is equal to a substrate atomic percent of the substrate semiconductor material in the semiconductor substrate.

The present invention provides a method for improving semiconductor surfaces.

BRIEF DESCRIPTION OF THE DRAWINGS

FIG. 1D' shows a plot that illustrates the relationship between the thicknesses of a first silicon layer and the thicknesses of a second silicon layer as a result of a simulation process of the formation of the semiconductor structure of FIG. 1D, in accordance with embodiments of the present invention.

DETAILED DESCRIPTION OF THE INVENTION

Figure 1A:
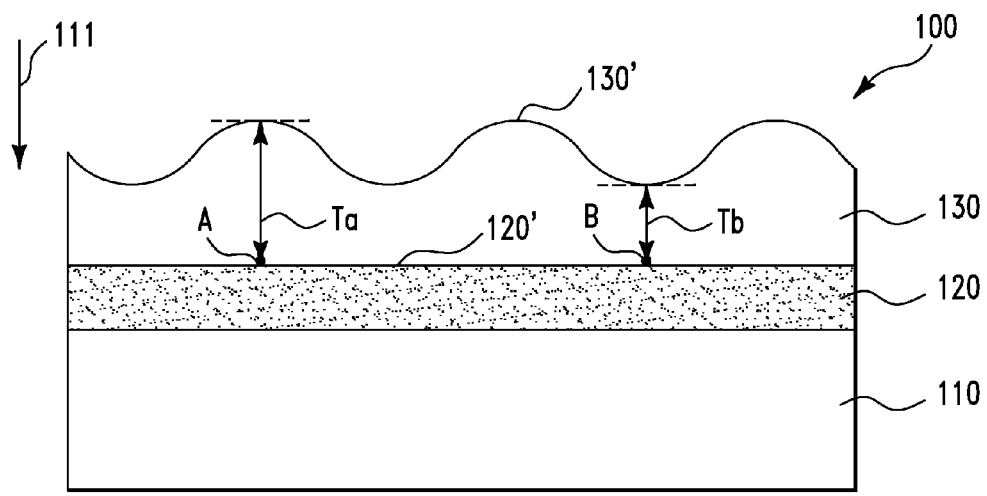
FIG. 1A shows a cross-section view of a semiconductor structure for illustrating a fabrication process, in accordance with embodiments of the present invention.

FIGS. 1A-1G illustrate a fabrication process of a semiconductor structure 100, in accordance with embodiments of the present invention. More specifically, with reference to FIG. 1A, the fabrication process of the semiconductor structure 100 can start with an SOI (Silicon On Insulator) substrate 110+120+130. The SOI substrate 110+120+130 can comprise a substrate layer 110, a dielectric layer 120 on top of the substrate layer 110, and a silicon layer 130 on top of the dielectric layer 120. The substrate 110 can comprise silicon. The dielectric layer 120 can comprise silicon dioxide. The SOI substrate 110+120+130 can be formed by a conventional method.

With reference to FIG. 1A, assume that the top surface 130' of the silicon layer 130 is not planar. Assume further that, at points A and B on the top surface 120' of the dielectric layer 120, the thickness Ta (at point A) of the silicon layer 130 in a direction defined by an arrow 111 (hereafter can be referred to as the direction 111) is greater than the thickness Tb (at point B) of the silicon layer 130 in the direction 111. The direction 111 is perpendicular to the top surface 120' of the dielectric layer 120.

Figure 1B:
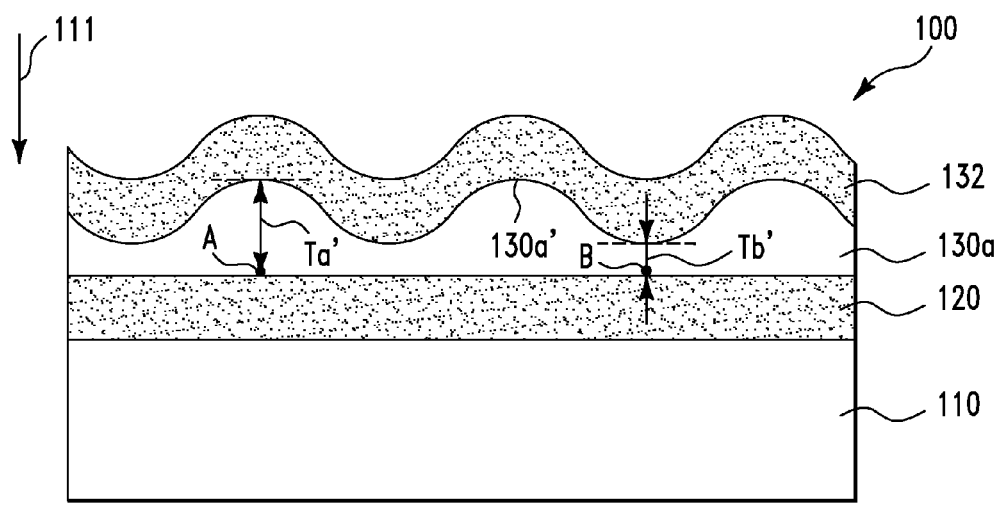
FIG. 1B shows a cross-section view of a semiconductor structure resulting from thermally oxidizing the top surface of a silicon layer of the semiconductor structure of FIG. 1A, in accordance with embodiments of the present invention.

Next, in one embodiment, the top surface 130' of the silicon layer 130 is thermally oxidized resulting in an oxide layer 132 and what remains of the silicon layer 130 of FIG. 1A after the thermal oxidation step is performed is the silicon layer 130a of FIG. 1B. It should be noted that the thermal oxidation rate in the direction 111 at any time point is the same throughout the top surface 130' of the silicon layer 130. As a result, with reference to FIGS. 1A and 1B, the difference of the thicknesses Ta and Ta' is equal to the difference of the thicknesses Tb and Tb' (i.e., Ta−Ta'=Tb−Tb'), wherein Ta' and Tb' are thicknesses in the direction 111 of the silicon layer 130a at points A and B, respectively. Therefore, the difference of the thicknesses Ta' and Tb' is equal to the difference of the thicknesses Ta and Tb (i.e., Ta'−Tb'=Ta−Tb). In other words, the top surface 130a' of the silicon layer 130a of FIG. 1B is not more or less planar than the top surface 130' of the silicon layer 130 of FIG. 1A. It is said that the top surface 130a' of FIG. 1B is not more or less planar than the top surface 130' of FIG. 1A if for any first point and second point on the top surface 120' of the dielectric layer 120, the difference of the thicknesses in the direction 111 at the first and second points of the silicon layer 130a is the same as the difference of the thicknesses in the direction 111 at the first and second points of the silicon layer 130'.

Figure 1C:
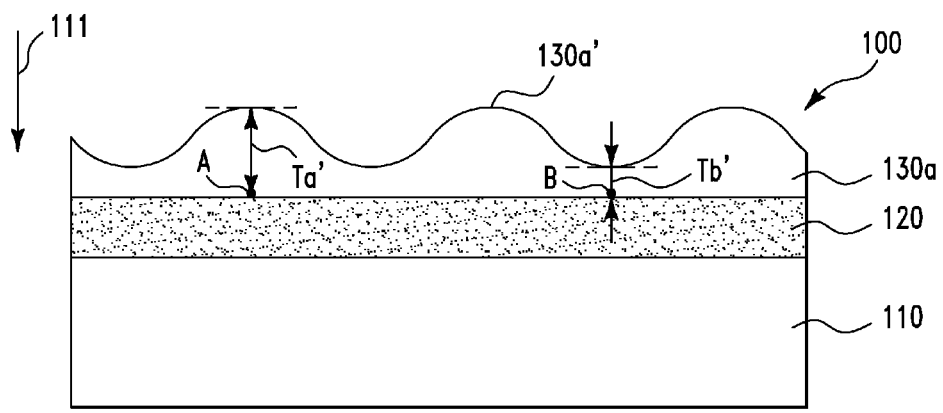
FIG. 1C shows a cross-section view of a semiconductor structure resulting from removing an oxide layer of the semiconductor structure of FIG. 1B, in accordance with embodiments of the present invention.

Next, in one embodiment, the oxide layer 132 is removed resulting in the structure 100 of FIG. 1C. More specifically, the oxide layer 132 can be removed by a conventional wet etching step (e.g., by HF etch). The thermal oxidation of the silicon layer 130 (FIG. 1A) resulting in the oxide layer 132 and the subsequent removal of the resultant oxide layer 132 (FIG. 1B) so as to reduce the thickness of the silicon layer 130 can be collectively referred to as a first thinning step.

Figure 1D:
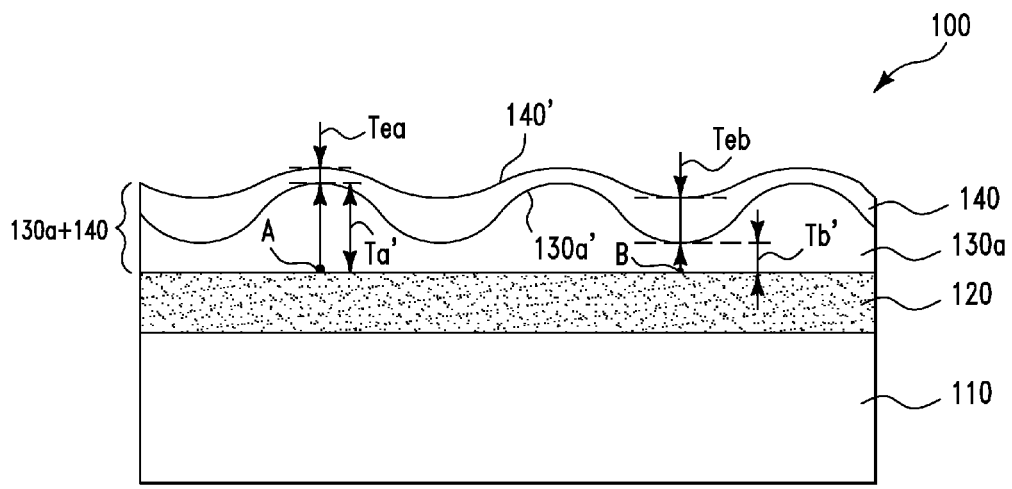
FIG. 1D shows a cross-section view of a semiconductor structure resulting from epitaxially growing a silicon layer on top of the semiconductor structure of FIG. 1C, in accordance with embodiments of the present invention.
Figure 1D:
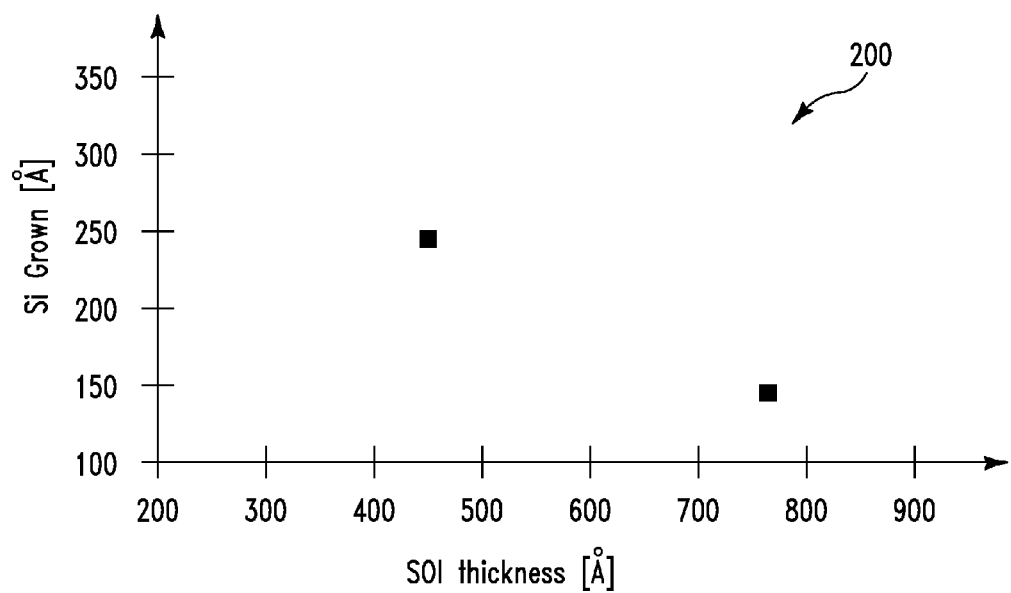

Next, in one embodiment, silicon is epitaxially grown on the top surface 130a' of the silicon layer 130a of FIG. 1C resulting in the silicon layer 140 of FIG. 1D. This epitaxial growth of silicon resulting in the silicon layer 140 can be referred to as a first epitaxial growth step. With reference to FIG. 1D, the inventors of the present invention have found that the thickness Tea in the direction 111 of the silicon layer 140 at point A is smaller than the thickness Teb in the direction 111 of the silicon layer 140 at point B. In general, the inventors of the present invention have found that, at a given point on the top surface 120' of the silicon layer 120 of FIG. 1D (like points A or B), the thicker the silicon layer 130a is, the thinner the silicon layer 140 is. In one embodiment, because of the first epitaxial growth step, the atomic percent of silicon in the silicon layer 140 is the same as the atomic percent of silicon in the silicon layer 130a. The atomic percent of a material in a layer is defined as 100 multiplied by the ratio of the number of atoms of the material in the layer to the total number of atoms in the layer.

The silicon layer 130a and the silicon layer 140 can be collectively referred to as a silicon layer 130a+140. The thickness of the silicon layer 130a+140 in the direction 111 at point A is the sum of the thicknesses Ta' and Tea which can be referred to as Ta'+Tea. The thickness of the silicon layer 130a+140 in the direction 111 at point B is the sum of the thicknesses Tb' and Teb which can be referred to as Tb'+Teb.

FIG. 1D' shows a plot that illustrates the relationship between the thicknesses Ta' and Tb' of the silicon layer 130a (FIG. 1C) and the thicknesses Tea and Teb of the silicon layer 140 (FIG. 1D) as a result of a simulation process of the formation of the structure 100 of FIG. 1D, in accordance with embodiments of the present invention. More specifically, as can be seen in FIG. 1D', Ta'=770 Å and Tea=150 Å, whereas Tb'=450 Å and Teb=250 Å. These values prove that, at a given point on the top surface 120' of the dielectric layer 120 of FIG. 1D, the thicker the silicon layer 130a is, the thinner the silicon layer 140 is.

Before the first epitaxial growth step is performed, the difference of thicknesses of the silicon layer 130a in the direction 111 at points A and B is Ta'−Tb'=770 Å−450 Å=320 Å. After the first epitaxial growth step is performed, the difference of thicknesses of the silicon layer 130a+140 in the direction 111 at points A and B is (Ta'+Tea)−(Tb'+Teb)=(770 Å+150 Å)−(450 Å+250 Å)=220 Å (which is less than 320 Å). In general, the inventors of the present invention have found that for any third point and fourth point on the top surface 120' of the dielectric layer 120 such that the difference of the thicknesses of the silicon layer 130a in the direction 111 at the third and fourth point is positive, the difference of the thicknesses of the silicon layer 130a+140 in the direction 111 at the third and fourth points is smaller than the difference of the thicknesses of the silicon layer 130a in the direction 111 at the third and fourth points. In other words, as a result of the formation of the silicon layer 140 by epitaxial process, the thickness variability of the top silicon layer is reduced. It should be also noted that the top surface 140' of the silicon layer 130a+140 is more planar than the top surface 130a' of the silicon layer 130a. It is said that the top surface 140' of the silicon layer 140 is more planar than the top surface 130a' of the silicon layer 130a if for any third point and fourth point on the top surface 120' of the dielectric layer 120 such that the difference of the thicknesses of the silicon layer 130a in the direction 111 at the third and fourth point is positive, the difference of the thicknesses of the silicon layer 130a+140 in the direction 111 at the third and fourth points is smaller than the difference of the thicknesses of the silicon layer 130a in the direction 111 at the third and fourth points.

Next, with reference to FIG. 1D, in one embodiment, after the first epitaxial growth step is performed, a second thinning step (similar to the first thinning step) is performed on the top surface 140' of the silicon layer 130a+140. More specifically, with reference to FIG. 1D, the top surface 140' of the silicon layer 140 is thermally oxidized resulting in an oxide layer 150 of FIG. 1E. Next, the oxide layer 150 is removed resulting in the structure 100 of FIG. 1F. The oxide layer 150 can be removed by a conventional wet etching step (e.g., by HF etch).

Figure 1E:
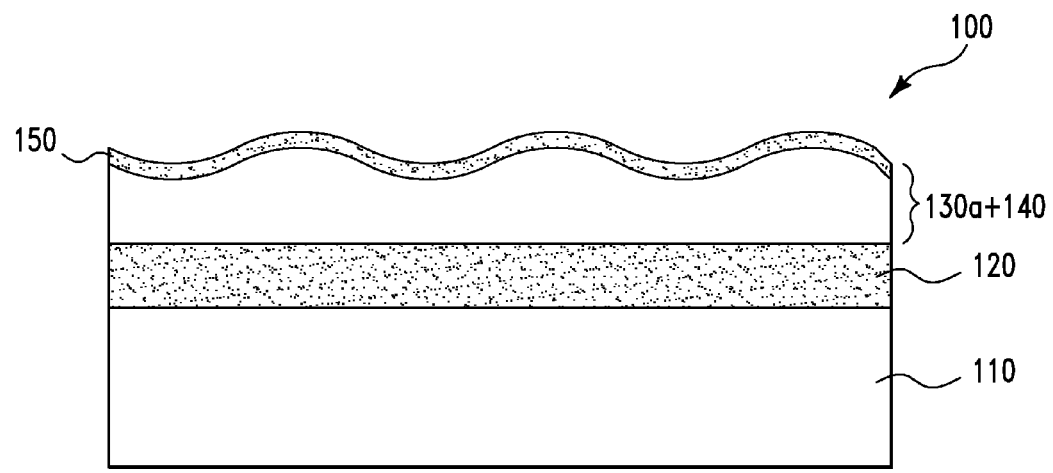
FIG. 1E shows a cross-section view of a semiconductor structure resulting from epitaxially growing a silicon layer on top of the semiconductor structure of FIG. 1D, in accordance with embodiments of the present invention.
Figure 1F:
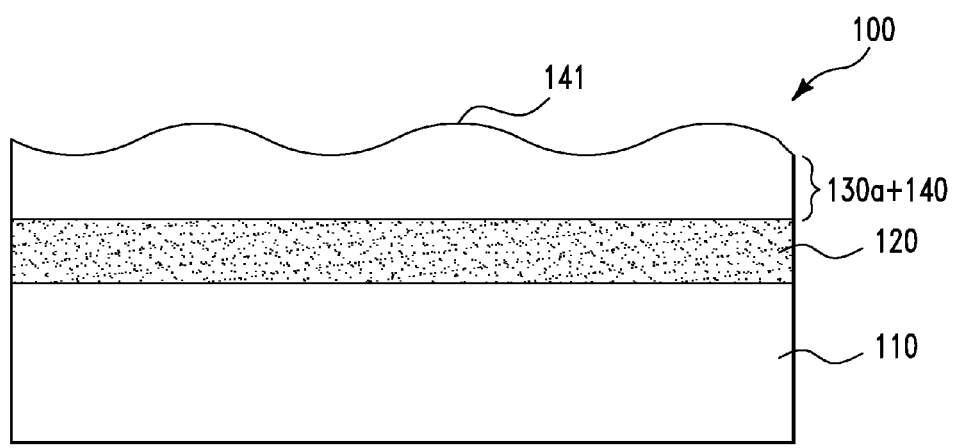
FIG. 1F shows a cross-section view of a semiconductor structure resulting from removing an oxide layer of the semiconductor structure of FIG. 1E, in accordance with embodiments of the present invention.
Figure 1G:
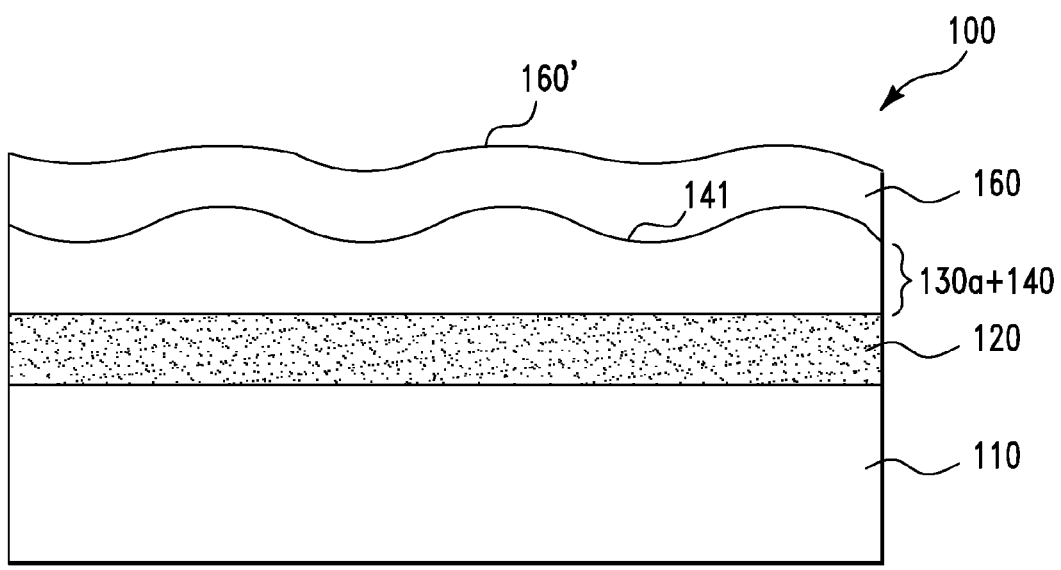
FIG. 1G shows a cross-section view of a semiconductor structure resulting from epitaxially growing a silicon layer on top of the semiconductor structure of FIG. 1F, in accordance with embodiments of the present invention.

Next, with reference to FIG. 1F, in one embodiment, after the second thinning step is performed, a second epitaxial growth step (similar to the first epitaxial growth step) is performed on the top surface 141 of the silicon layer 130a+140 resulting in a silicon layer 160 of FIG. 1G. The inventors of the present invention have found that for any fifth point and sixth point on the top surface 120' of the dielectric layer 120 such that the difference of thicknesses of the silicon layer 130a+140 in direction 111 at the fifth point and sixth point is positive, the difference of the thicknesses of the silicon layer 130a+140+160 in the direction 111 at the fifth and sixth points is smaller than the difference of the thicknesses of the silicon layer 130a+140 in the direction 111 at the fifth and sixth points. In other words, as a result of the formation of the silicon layer 160 by epitaxial process, the thickness variability of the top silicon layer is reduced. It should be also noted that the top surface 160' (FIG. 1G) of the silicon layer 130a+140+160 is more planar than the top surface 141 (FIG. 1G) of the silicon layer 130a+140.

Next, in one embodiment, a third thinning step and then a third epitaxial growth step, a fourth thinning step and then a fourth epitaxial growth step, and so on (similar to the third thinning step and then the third epitaxial growth step) are performed in turn on the top surface 160' of the silicon layer 130a+140+160 so as to make the top surface 160' of the silicon layer 130a+140+160 more planar.

Next, in one embodiment, a final thinning step is performed to achieve a desired thickness for the silicon layer on top of the dielectric layer 120.

Next, in one embodiment, devices (transistors, capacitors, registers, etc.) are formed on the silicon layer 130a+140+160.

In summary, a plurality of epitaxial growth steps and thinning steps (like the first and second epitaxial growth steps and the first and second thinning steps) can be performed on the top surface of a silicon layer so as to make this top surface more planar and achieve a desired thickness of the silicon layer for fabricating devices.

In the embodiments described above, with reference to FIG. 1A, the thickness Ta can be around 0.2 µm. The thickness Ta' (FIG. 1C) after the first thinning step is performed can be around 400 Å.

In the embodiments described above, the first thinning step is performed before the first epitaxial growth step is performed. In an alternative embodiment, the first thinning step can be omitted.

In the embodiments described above, the second epitaxial growth step is performed after the second thinning step is performed on the silicon layer 130a+140 of FIG. 1E. In an alternative embodiment, the second epitaxial growth step is performed without the second thinning step. In other words, second epitaxial growth step is performed right after the first epitaxial growth is performed. In this alternative embodiment, between the first and second epitaxial growth steps, the top surface 140' of the silicon layer 130a+140 is not exposed to silicon atoms in the surrounding ambient.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:

providing a semiconductor substrate, wherein the semiconductor substrate comprises a first substrate layer that includes silicon, an oxide layer that includes silicon dioxide and is on and in direct physical contact with the first substrate layer, and a semiconductor substrate layer consisting of an upper portion and a lower portion, wherein a total bottom surface of the lower portion of the semiconductor substrate layer is in direct physical contact with the oxide layer, wherein the lower portion of the semiconductor substrate layer is directly below the upper portion of the semiconductor substrate layer and is sandwiched between the upper portion of the semiconductor substrate layer and the oxide layer, wherein the upper portion of the semiconductor substrate layer comprises a substrate semiconductor material, and wherein the lower portion of the semiconductor substrate layer comprises the substrate semiconductor material;

after said providing the semiconductor substrate is performed, removing the upper portion of the semiconductor substrate layer such that the total bottom surface that existed prior to said removing the upper portion of the semiconductor substrate layer remains on and in direct physical contact with the oxide layer; and after said removing the upper portion of the semiconductor substrate layer is performed, epitaxially growing a first semiconductor layer on the lower portion of the semiconductor substrate layer, wherein after said epitaxially growing the first semiconductor layer is performed, a first atomic percent of a first semiconductor material in the first semiconductor layer is equal to a substrate atomic percent of the substrate semiconductor material in the lower portion of the semiconductor substrate layer, wherein the first semiconductor material and the substrate semiconductor material each consist of silicon, wherein said removing the upper portion of the semiconductor structure layer comprises: thermally oxidizing the upper portion of the semiconductor substrate layer to generate a substrate dielectric layer that replaces the upper portion of the semiconductor substrate layer, and removing the substrate dielectric layer.

2. The method of claim 1, said method further comprising:

after said epitaxially growing the first semiconductor layer is performed, removing a first top portion of the first semiconductor layer, resulting in a remaining portion of the first semiconductor layer on and in direct physical contact with the lower portion of the semiconductor substrate layer, wherein the remaining portion of the first semiconductor layer comprises the first semiconductor material.

3. The method of claim 2, wherein said removing the first top portion of the first semiconductor layer comprises:

thermally oxidizing the first top portion of the first semiconductor layer to generate a first dielectric layer that replaces the first top portion of the first semiconductor layer; and removing the first dielectric layer.

4. The method of claim 2, said method further comprising, after said removing the first top portion of the first semiconductor layer is performed, epitaxially growing a second semiconductor layer on the remaining portion of the first semiconductor layer.

5. The method of claim 4, wherein a second atomic percent of a second semiconductor material in the second semiconductor layer is equal to the first atomic percent of the first semiconductor material in the first semiconductor layer, wherein the second semiconductor material consists of silicon.

6. The method of claim 4, said method further comprising:

after said epitaxially growing the second semiconductor layer is performed, removing a second top portion of the second semiconductor layer, resulting in a remaining portion of the second semiconductor layer on and in direct physical contact with the remaining portion of the first semiconductor layer, wherein the remaining portion of the second semiconductor layer comprises the second semiconductor material.

7. The method of claim 6, wherein said removing the second top portion of the second semiconductor layer comprises:

thermally oxidizing the second top portion of the second semiconductor layer a second dielectric layer that replaces the second top portion of the second semiconductor layer; and removing the second dielectric layer.

8. The method of claim 4, wherein said epitaxially growing the second semiconductor layer results in:

the oxide layer being on and in direct physical contact with the first substrate layer;

the lower portion of the semiconductor substrate layer portion being on and in direct physical contact with the oxide layer;

the remaining portion of the first semiconductor layer being on and in direct physical contact with the lower portion of the semiconductor substrate layer; and the second semiconductor layer being on and in direct physical contact with the remaining portion of the first semiconductor layer.

9. The method of claim 1, wherein said epitaxially growing the first semiconductor layer results in:

the oxide layer being on and in direct physical contact with the first substrate layer;

the lower portion of the semiconductor substrate layer portion being on and in direct physical contact with the oxide layer; and the first semiconductor layer being on and in direct physical contact with the lower portion of the semiconductor substrate layer.

* * * * *